United States Patent [19]
Cava et al.

[11] Patent Number: 6,074,603
[45] Date of Patent: *Jun. 13, 2000

[54] ARTICLE COMPRISING AN INTERMETALLLIC SUPERCONDUCTOR MATERIAL

[75] Inventors: Robert Joseph Cava, Bridgewater; James Joseph Krajewski, Raritan, both of N.J.

[73] Assignee: Lucent Technologies Inc., Murray Hill, N.J.

[*] Notice: This patent is subject to a terminal disclaimer.

[21] Appl. No.: 09/351,536

[22] Filed: Jul. 12, 1999

Related U.S. Application Data

[63] Continuation of application No. 08/165,143, Dec. 10, 1993, which is a continuation-in-part of application No. 08/143,419, Oct. 26, 1993, Pat. No. 5,413,755.

[51] Int. Cl.[7] .............................. C22C 5/04; C22C 19/03
[52] U.S. Cl. .................... 420/455; 420/456; 420/463; 420/901; 505/805
[58] Field of Search ...................... 420/455, 456, 420/463, 901; 505/124, 805

[56] References Cited

U.S. PATENT DOCUMENTS

| | | | |
|---|---|---|---|
| 4,264,358 | 4/1981 | Johnson et al. | 420/901 |
| 5,413,755 | 5/1995 | Cava | 420/463 |
| 5,470,530 | 11/1995 | Cava et al. | 420/455 |

*Primary Examiner*—George Wyszomierski
*Attorney, Agent, or Firm*—Eugen E. Pacher

[57] ABSTRACT

A novel intermetallic superconductor with surprisingly high transition temperature is disclosed. The material comprises B and C, and can form a bulk superconductor. Exemplary of the novel superconductors is material of nominal composition $YPd_5B_3C_x$, with x chosen such that the C:B ratio is in the range 0.05–2. An exemplary bulk sample of such composition has $T_c$ (onset) of 22.5 K, with more than 15 volume % of the sample being superconducting.

3 Claims, 2 Drawing Sheets ic SUPERCONDUCTOR
MATERIAL

REFERENCE TO RELATED APPLICATIONS

This is a request for filing a continuation of prior application Ser. No. 08/165,143, filed on Dec. 10, 1993 entitled Article Comprising An Intermetallic Superconductor Material which is a continuation-in-part of application Ser. No. 08/143,419, filed Oct. 26, 1993, 5,413,755, by R. J. Cava, which is a CIP of 08/143,419, 10/26/93 now U.S. Pat No. 5,413,755.

FIELD OF THE INVENTION

This application pertains to superconducting compositions, more specifically, to intermetallic superconducting compositions.

BACKGROUND OF THE INVENTION

Before the recent discovery of copper-oxide based superconductors, the materials with th highest superconducting critical temperatures ($T_c$) were Niobium and Vanadium-based intermetallic compounds with the "A15" structure type. These are based on stoichiometry $A_3$ B, with the earliest examples $V_3Si$ ($T_c$=17K) and $Nb_3Sn$ ($T_c$=18K) discovered in 1953. $T_c$'s in the vicinity of 20K are obtained for Nb-based materials only, with the record high $T_c$ of 23K for $Nb_3Ge$ obtainable in sputtered thin films only, not in bulk material. The highest known bulk $T_c$ is 20.7 K for $Nb_3Ga$. The existence of these and many other Nb-based superconductors with lower $T_c$'s have led to the general belief that intermetallic superconductors should include Nb in the chemical system for the best results.

The superconducting magnets currently in wide use in machines such as MRI scanners employ Nb based alloy wire, but preparation of bulk materials with very high $T_c$'s in the A15 structure type has proven difficult. In view of this difficulty, alternative intermetallic superconducting materials with high $T_c$'s would be of considerable interest Although the $T_c$'s of such intermetallic superconductors might be expected to be lower than those of the copper oxide based ceramic superconductors, the better processability and manufacturability of metals, along with the likelihood of good superconducting critical currents suggests possible advantages over ceramic materials for use at low temperatures.

Although the $T_c$'s of prior art boride superconductors are low, less than 12K, it has been widely speculated that the low mass of boron might result in the presence of high frequency lattice vibrations, and consequently the possibility for relatively high $T_c$'s. Recently, indications of superconductivity were discovered in a Y-Ni-boride composition. See C. Mazumdar et al., *Solid State Communications,* Vol. 87(5), pp.413–416. A newly discovered Y-Ni-boride, an intermetaliic composition, was formed by melting Y, Ni and B in nominal 1:4:1 atomic ratio in an arc furnace, and had $T_c$ (onset) of about 12K. However, superconductivity was not present at high levels in the samples.

In view of the great significance of intermetallic superconducting compositions, a new such composition would be of great interest, both scientifically and technologically. This application discloses such compositions.

GLOSSARY AND DEFINITIONS

An "intermetallic" composition is a composition of matter consisting essentially only of (two or more) metallic elements. Boron (B) and carbon (C) are metallic elements.

Associated with a sample of superconductor material typically are several "transition temperatures" $T_c$. Among them are $T_c$ (onset) and $T_c$ (R=0). The former is the highest temperature at which an indication of superconductivity is observable, and t he latter is the highest temperature at which the DC electrical resistance of the ;ample is essentially zero, to within experimental accuracy. $T_c$ (onset) applies t all appropriate experimental techniques, e.g., resistivity measurements or magnetic measurements.

THE INVENTION

I have discovered a new intermetallic superconductor having a surprisingly high transition temperature, exemplarily 22.6K in a bulk sample, higher than that of bulk $Nb_3Ge$, indeed, higher than that of any other bulk intermetallic composition.

The invention is embodied in an article that comprises a quantity of material that exhibits superconductivity. The material is an intermetallic material that comprises Y Pd and B, with the chemical composition of the material selected such that the material has a critical temperature $T_c$ (onset) of 20K or higher.

Exemplary of the new superconductor is material of overall composition $Y_{1.5}Pd_{4.5}B_4$, which was found to have $T_c$ (onset) of 22.6K The magnitude of the diamagnetic response of a sample was indicative of the presence of about 0.5 volume % of superconducting material in a non-superconducting matrix.

Figure 1:
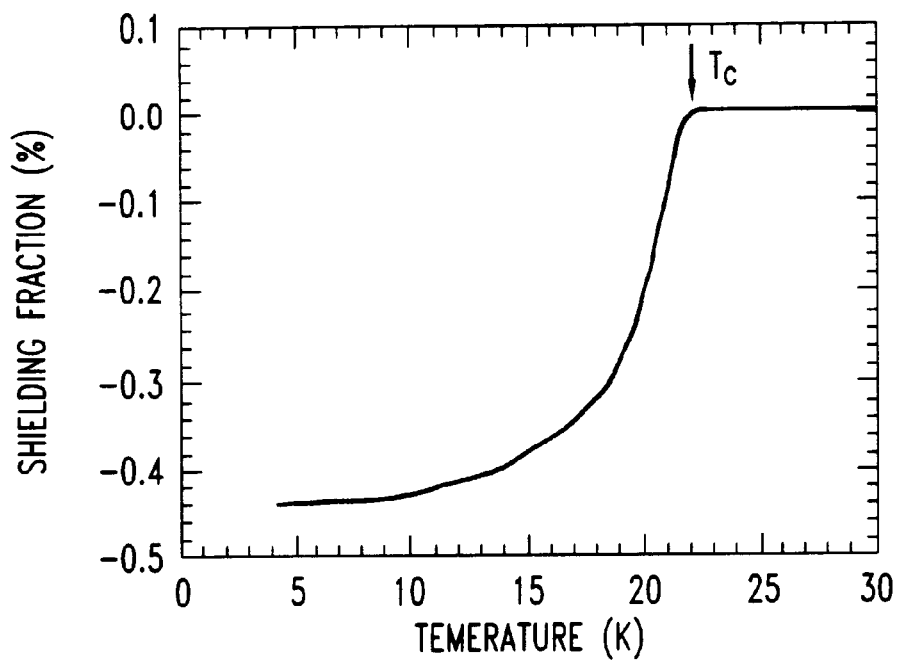
FIGS. 1, 3, 4 and 5 show magnetic susceptibility data of exemplary compositions according to the invention.

Exemplarily, the new superconducting composition was prepared by mixing elemental Y, Pd and B (purity at least 99.9%) in the desired atomic ratio, e.g., 1.5:4.5:4. The starting materials were in the form of coarse powders, small chunks or metal shavings. The mixture, exemplarily 1 gram weight, was pressed into a small pellet by conventional means. The pellet was arc melted in a commercially apparatus (Centorr Furnaces, Nashua, N.H.) under an Ar atmosphere. After solidification and cooling, the resulting button was turned over and melted again under substantially the same conditions. This melting process was repeated once, but can be repeated more often to ensure sample homogeneity. After completion of the process of making the intermetallic sample, a portion of the sample was tested by conventional means (ac susceptibility, Lakeshore Model 7000 Susceptometer). FIG. 1 shows exemplary results, obtained on 0.3188g of material of nominal composition $Y_{1.5}Pd_{4.5}B_4$, prepared as described above. The data shows that the exemplary material has $T_c$ (onset) of 22.6K, with about half of one percent of the total material being superconducting.

Figure 2:
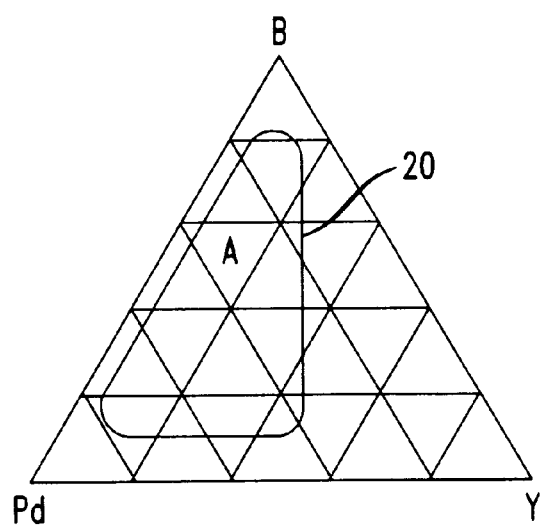
FIG. 2 indicates currently preferred compositions in the Y-Pd-B compositional spice.

The disclosed Y:Pd:B atomic ratio (1.5:4.5:4) is exemplary only. FIG. 2 shows the compositional space of the Y-Pd-B system in conventional form. The region of the compositional phase that, according to my present understanding, contains the preferred compositions according to the invention is region A, enclosed by line 20.

We have now discovered that addition of C to the Y-Pd-B can have beneficial effects, including a substantial increase in the fraction of the sample that is superconducting, and possibly a modest increase in $T_c$ (onset). Indeed, based on our investigation of arc melted samples of material in the Y-Pd-B-C quaternary system, we currently believe that the presence of carbon is necessary for the occurrence of bulk superconductivity in that system.

Exemplarily, samples were prepared by arc-melting. Starting materials were commercially available Y shavings (99.9% purity), Pd powder (>99.99% purity), and coarse C (99.99% purity) and B powder (99.6% purity, largest impurity 0.17% C). Samples of about 0.6 to 0.75 gm total weight were first pressed into 0.25-inch diameter pellets. The pellets were then arc-melted under Ar on a standard water cooled co per hearth. Melting was repeated up to two or more times, with the button turned over between meltings. Exemplarily, superconductivity was observed for thus prepare samples having a relatively low carbon content. Those skilled in the art will understand that the composition of the phase (or phases) responsible for the observed superconductivity may depart from the nominal composition of the superconducting sample.

Exemplarily, samples of nominal composition $YPd_5B_3C_x$ (0.3 < x < 0.4) exhibited large magnetic shielding fractions, up to approximately 80%, and large magnetic flux exclusion fractions (Meissner effect), 10–15% of that expected for an ideal diamagnet. As those skilled in the art know, the Meissner effect fraction re resents a lower limit to the actual fraction of superconducting phase present in the sample, due to flux pinning effects.

Figure 3:
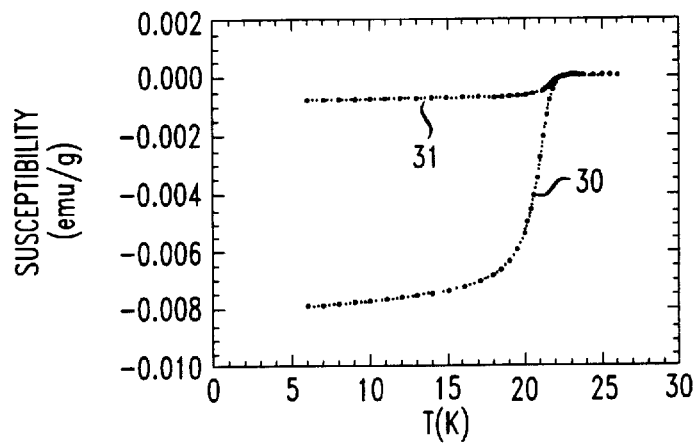

FIG. 3 shows exemplary magnetization data vs. temperature, for a sample of composition $YPd_5B_3C_{0.35}$, prepared as described above. Reference numeral 30 refers to the shielding curve, and 31 refers to the Meissner effect curve. The former attained a value of about 75% (of the signal expected from a corresponding ideal diamagnet) at 5K, and the latter attained a value of about 10% (also of the sign expected from the ideal diamagnet) at that temperature. The measurements were made with a commercially available (Quantum Design) SQUID magnetometer in conventional manner, with an applied field of 20 Oe. The results indicate $T_c$ (onset) of about 22.5K. Similar results are obtained for other samples having Y, Pd an B content in region A of FIG. 2. Exemplarily, the carbon content is in the range 5–200% of the (atomic) B content. More generally, the composition of Y-Pd-B-C co positions according to the invention is $Y_yPd_zB_{x'} \cdot C_x$ with $0.5 \leq y \leq 1.5$, $2 \leq z \leq 6$, $1 \leq x' \leq 4$, and x:x' in the range 0.05–2.

We have also measured the DC resistivity of various samples. For instance, a sample of nominal composition $YPd_5B_3C_{0.35}$ had room temperature resistivity of about 200 $\mu\Omega$.cm, with relatively little resistivity decrease during cooling until the onset temperature is reached. $T_c$ (onset) was about 23K, the 10–90% transition width was 0.3K.

Heat treatment after solidification of the melt may affect the superconducting properties of the resulting material. For instance, annealing a (Ta foil wrapped) superconducting sample for two days at 900° C. in a sealed evacuated quartz tube resulted in complete loss of superconductivity.

Samples were also prepared by melting a sample of the (previously prepared) tern r (omitting C) or quaternary (including C) alloy on a carbon block (volume about 2cc) laid on the copper hearth. This set-up resulted in slower cooling of the sample, since the heated carbon block cooled relatively slowly. However, this preparatory technique did not allow for close control of the carbon content of the resulting material, since carbon from the block was likely to become incorporated into the sample.

Figure 4:
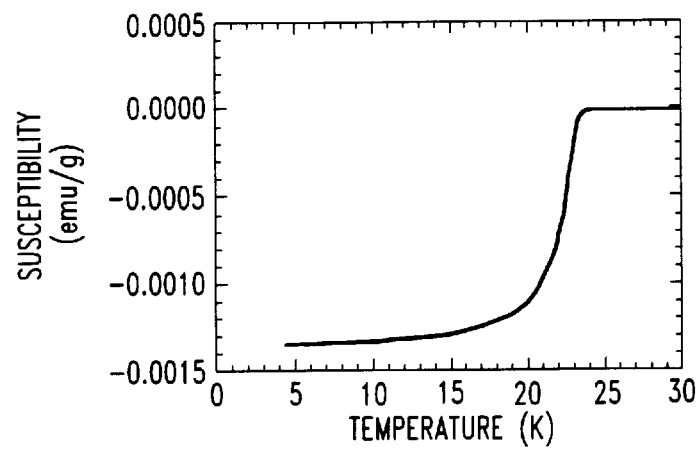

FIG. 4 shows magnetic shielding data for a sample produced by melting pre-melted ternary material of nominal composition $Y_{1.25}Pd_{4.5}B_{4.25}$ on a carbon block as described above. The sample had $T_c$ (onset) of about 23K, the highest temperature at which any bulk intermetallic sample has exhibited superconductivity to date.

Figure 5:
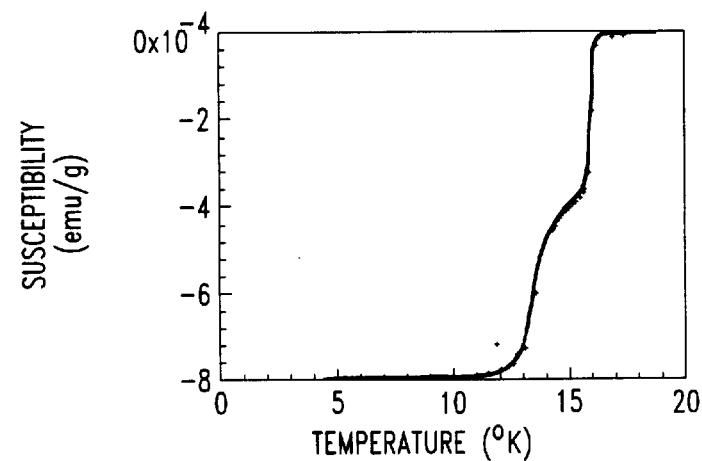

Although the currently preferred compositions belong to the Y-Pd-B-C system, the invention is not so limited. For instance, we have discovered that some materials of nominal composition $Lu_yNi_zB_{x'} \cdot C_x$, or $Y_yNi_zB_{x'} \cdot C_x$ ($0.5 \leq y \leq 1.5$, $2 \leq z \leq 6$, $1 \leq x' \leq 4$, and x:x' in the range 0.05–2), synthesized as described above, were bulk superconductors, with $T_c$ (onset) in the range 14–17K Lu-Ni-B-C and Y-Ni-B-C samples remained superconducting after an anneal at 900° C. in vacuum. FIG. 5 shows magnetic susceptibility (Meissner effect) data for an exemplary sample of nominal composition $LuNi_4B_3C$ and weight 0.13g. The hump at about 15K is believed to be due to flux trapping.

Our results to date indicate that material that contains, in addition to B and C, one or more elements M selected from the group consisting of Y, the lanthanides (atomic number 57–71) and the alkaline earths, and further contains one or more transition metals M' can exhibit superconducting properties. The material thus has general formula $M_yM'_zB_{x'} \cdot C_x$, with $0.5 \leq y \leq 1.5$, $2 \leq z \leq 6$, $1 \leq x' \leq 4$, and x:x' in the range 0.05–2.

What is claimed is:

1. An article comprising a quantity of material that exhibits superconductivity, wherein the material is an intermetallic material of general formula $M_yM'_zB_{x'}C_x$, where $0.5 \leq y \leq 1.5$, $2 \leq z \leq 6$, $1 \leq x' \leq 4$, and x:x' is in the range 0.05–2, with M selected from the group consisting of Y, the lanthanides, and combinations thereof, and M' selected from the group consisting of Ni, Pd, and a combination of Ni and Pd.

2. An article according to claim 1, wherein the material is of composition selected to provide superconducting properties at 20K or above.

3. An article according to claim 1, wherein the intermetallic material consists essentially of Y, Pd, B and C, or the intermetallic material consists essentially of Y, Ni, B and C, or the intermetallic material consists essentially of Lu, Ni, B and C.

* * * * *